US012656841B2

(12) United States Patent
Wesley

(10) Patent No.: US 12,656,841 B2
(45) Date of Patent: Jun. 16, 2026

(54) COOLING CASE FOR ELECTRONIC DEVICE

(71) Applicant: Joseph Leo Wesley, Pismo Beach, CA (US)

(72) Inventor: Joseph Leo Wesley, Pismo Beach, CA (US)

( * ) Notice: Subject to any disclaimer, the term of this patent is extended or adjusted under 35 U.S.C. 154(b) by 118 days.

(21) Appl. No.: 18/431,212

(22) Filed: Feb. 2, 2024

(65) Prior Publication Data

US 2025/0251764 A1     Aug. 7, 2025

(51) Int. Cl.
G06F 1/20 (2006.01)
G03B 17/56 (2021.01)
G06F 1/16 (2006.01)
H05K 7/20 (2006.01)

(52) U.S. Cl.
CPC ............ G06F 1/203 (2013.01); G06F 1/1607 (2013.01); H05K 7/20172 (2013.01); G03B 17/566 (2013.01)

(58) Field of Classification Search
CPC ... G06F 1/203; G06F 1/1607; H05K 7/20172; G03B 17/566
See application file for complete search history.

(56) References Cited

U.S. PATENT DOCUMENTS 7,830,661 B2 * 11/2010 Sween ...................... G06F 1/20
                                                361/679.48
8,936,072 B2 * 1/2015 Senatori .................. G06F 1/203
                                                165/104.34

11,119,544 B1 * 9/2021 Perez ................. H05K 7/20154
11,502,389 B2 * 11/2022 Lin ........................... H01Q 1/48
11,539,824 B2 * 12/2022 Chen ...................... H01L 23/38
2007/0103909 A1 * 5/2007 Park .................. H05K 7/20972
                                                362/294
2007/0119734 A1 * 5/2007 Pichahchi .............. A45C 13/02
                                                206/320
2009/0078707 A1 * 3/2009 Chen ......................... A45F 5/00
                                                206/592
2010/0270188 A1 * 10/2010 Dotson .................. A45C 11/00
                                                165/47
2013/0105644 A1 * 5/2013 Yu .......................... F16M 11/14
                                                248/125.7
2013/0126688 A1 * 5/2013 Li ........................... F16M 11/14
                                                248/276.1
2013/0146491 A1 * 6/2013 Ghali .................... G06F 1/1626
                                                53/472
2013/0294020 A1 * 11/2013 Rayner ................. G06F 1/1626
                                                361/679.01

(Continued)

OTHER PUBLICATIONS

Mygoflight Sport, Mygoflight Sport Camera Adapter MNT-1665, Waybackmachine; https://web.archive.org/web/20221201122145/ https://www.aircraftspruce.com/catalog/avpages/mgf-mnt-1665. php (Year: 2022).*

(Continued)

*Primary Examiner* — Michael A Matey
(74) *Attorney, Agent, or Firm* — Sam Pierce

(57)     ABSTRACT

An embodiment of the present invention is a case for an electronic device, comprising: a case frame for holding an electronic device; an internal fan directing air across the back of the electronic device; and an internal rechargeable battery for powering the internal fan.

8 Claims, 3 Drawing Sheets

(56) References Cited

U.S. PATENT DOCUMENTS

| | | | | |
|---|---|---|---|---|
| 2014/0162735 A1* | 6/2014 | Oh | ...................... | G06F 3/03545 |
| | | | | 455/575.8 |
| 2014/0218330 A1* | 8/2014 | Ady | .................... | H03K 17/962 |
| | | | | 345/174 |
| 2014/0235156 A1* | 8/2014 | Li | .......................... | G06F 1/203 |
| | | | | 454/184 |
| 2015/0017905 A1* | 1/2015 | Li | ........................ | H04B 1/3888 |
| | | | | 454/184 |
| 2015/0198981 A1* | 7/2015 | Chung | .................... | C25D 5/02 |
| | | | | 361/679.55 |
| 2015/0207911 A1* | 7/2015 | Lin | ....................... | H04M 1/035 |
| | | | | 455/569.1 |
| 2015/0355693 A1* | 12/2015 | Chang | ............... | H05K 7/20209 |
| | | | | 361/679.48 |
| 2017/0196327 A1* | 7/2017 | Ma | ........................ | G06F 1/1626 |
| 2017/0235348 A1* | 8/2017 | Wolf | ....................... | G06F 1/203 |
| | | | | 361/679.46 |
| 2018/0307284 A1* | 10/2018 | Saravis | ................ | G06F 1/1626 |
| 2021/0033916 A1* | 2/2021 | Uchimi | .................... | G09G 3/36 |
| 2021/0184476 A1* | 6/2021 | Zeng | ................... | H01F 27/2876 |
| 2023/0010995 A1* | 1/2023 | Lin | ....................... | G06F 1/1626 |
| 2023/0318653 A1* | 10/2023 | Khalifeh | ................. | C08J 5/244 |
| | | | | 455/575.1 |
| 2024/0011958 A1* | 1/2024 | Hammond | ............ | H02J 7/0044 |

OTHER PUBLICATIONS

Mavicpilots, Mavmount Scout adapter for DJI top mount controllers; https://mavicpilots.com/threads/announcing-the-new-mavmount-scout-adapter-for-dji-top-mount-controllers-pics-inside. 107340/ (Year: 2021).*

* cited by examiner

10

COOLING CASE FOR ELECTRONIC DEVICE

BACKGROUND

An overheated tablet or smartphone usually runs slower, drains the battery fast, shortens its life span, or even can explode or catch on fire. Cooling cases to reduce these risks have been described in the prior art patent literature.

For example, U.S. Pat. No. 9,608,686 discloses a case for cooling a portable electronic device, the case including a housing and a cartridge. The housing holds the electronic device and has a cartridge compartment for retaining the cartridge. The cartridge includes sets of compartments for retaining substances configured to generate an endothermic reaction when mixed or combined. Pairs of compartments are separated by a divider configured to be selectively breached. The duration of the cooling effect may be extended by periodically breaching dividers of additional compartment pairs. The magnitude of the cooling effect may be increased by breaching multiple compartment pairs at once. The case may also include electronic components for monitoring the temperature of the electronic device and automatically initiating an endothermic reaction when the temperature reaches a predetermined threshold.

US20210242890 discloses a protective and cooling case for an electronic device able to reduce the temperature of the electronic device while protecting said electronic device. The protective and cooling case includes a case body, a securing mechanism, and at least one cooling module. The case body is a structure that is wrapped around the electronic device in order to protect the electronic device from shock forces when or if accidentally dropped. The case body can be any shape and size to protect various types of electronic devices such as, but not limited to, mobile phones or electronic tablets. The securing mechanism is a means to securely attach the at least one cooling module to the case body. The at least one cooling module is used to reduce the temperature of the electronic device.

However, prior art cooling cases are lacking in durability, flexibility for operation in varied environments and suitability for critical applications like aviation.

SUMMARY OF INVENTION

Therefore, the present invention provides a case for an electronic device with a cooling fan also containing an internal battery for recharging the electronic device. An embodiment of the present invention is made of carbon impregnated plastic as well as carbon fiber for strength and impact as well as fire resistance.

According to an aspect of the present invention, there is provided a case for an electronic device, comprising: a case frame for holding an electronic device; an internal fan directing air across the back of the electronic device; and an internal rechargeable battery for powering the internal fan.

DETAILED DESCRIPTION

Although optimized for use in aviation and compatible with various mounting systems in the aviation and drone industries, the present invention also is highly useful in other industries where protection, cooling, and powering of electronic devices is mission-critical.

The present invention promotes safety by greatly reducing EFB/iPad/tablet overheating to and offering impact protection iPad/EFB/tablets.

The present invention also provides battery backup to USB power devices. A preferred embodiment of the present invention has an internal rechargeable battery.

The present invention offers cockpit mounting capability for propellor and jet aircraft pilots and transmitter mounting capabilities for drone pilots. The present invention is compatible with MyGoFlight's Sport Mount System by using the MNT-1665 Sport Camera Adapter. It is also compatible with RAM mounting systems, X-Grip Mount. It is compatible with all MAVMOUNT Controller Adapters as well as other systems available for drones.

Figure 1:
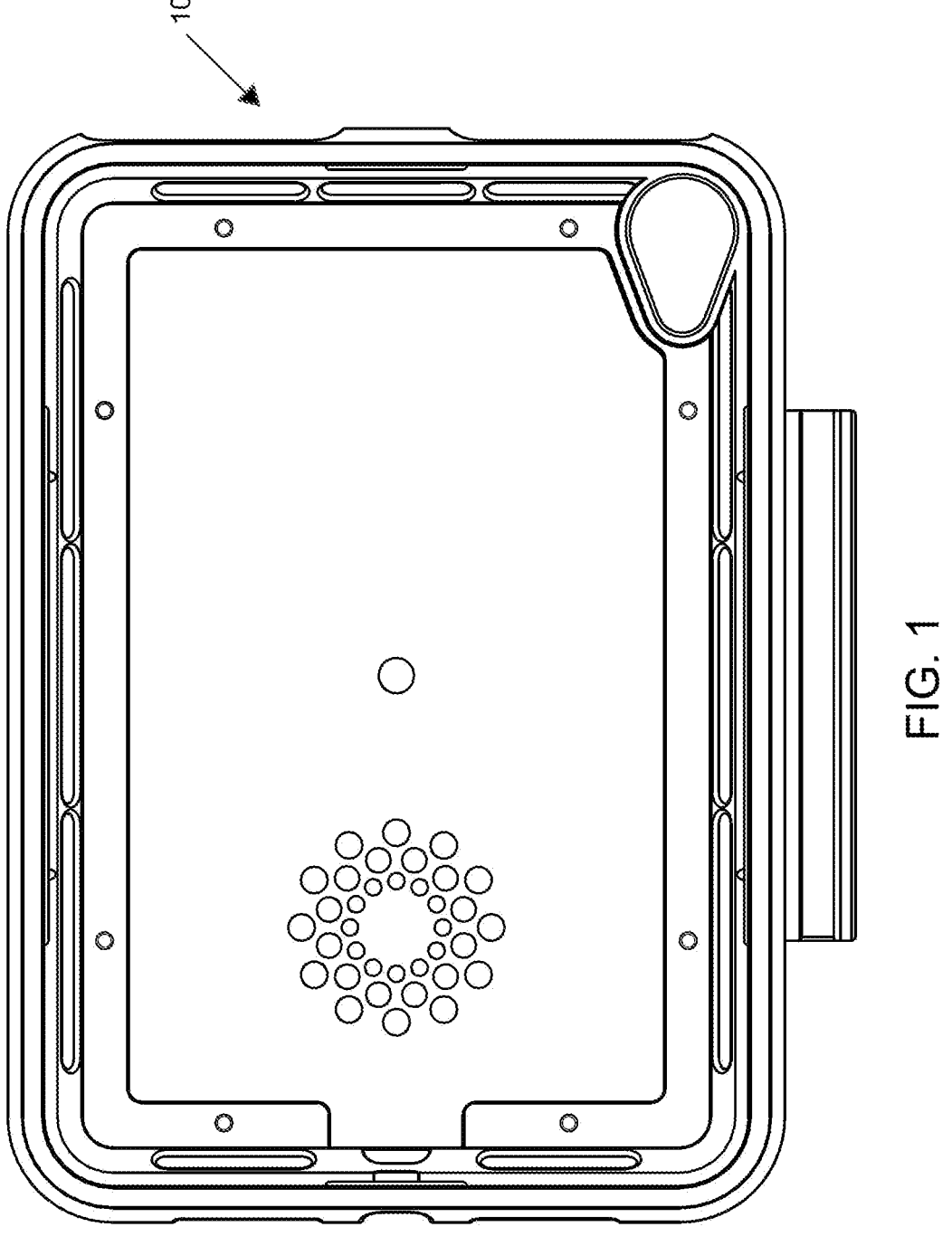
FIG. 1 illustrates a top view of the electronic device cooling case according to the present invention.

FIG. 1 illustrates a top view of the electronic device cooling case according to the present invention.

Case 10 draws cool air in through an internal fan and directs it across the back of the electronic device, keeping it from overheating. Efficient cooling is provided by having the cooling capability utilized when needed by pushing the on/off button on the back side of the case.

Figure 2:
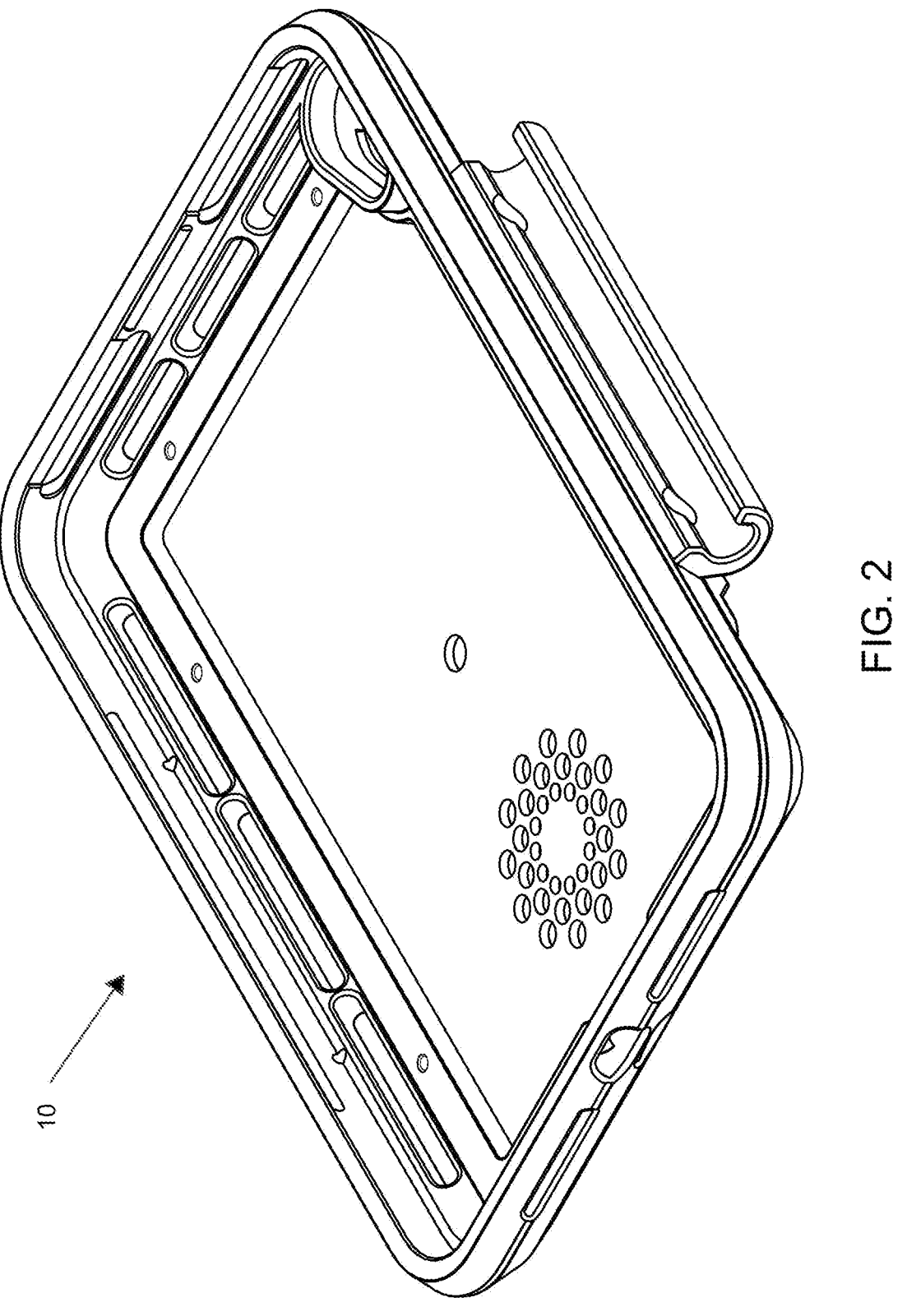
FIG. 2 illustrates a perspective view of the electronic device cooling case according to the present invention.

FIG. 2 illustrates a perspective view of the electronic device cooling case according to the present invention.

Power cables are not needed for case 10. A high-capacity internal rechargeable battery powers the cooling feature. This internal battery can also charge USB devices such as mobile phones and other common USB-powered products by simply plugging the device into the provided USB-C input port.

Figure 3:
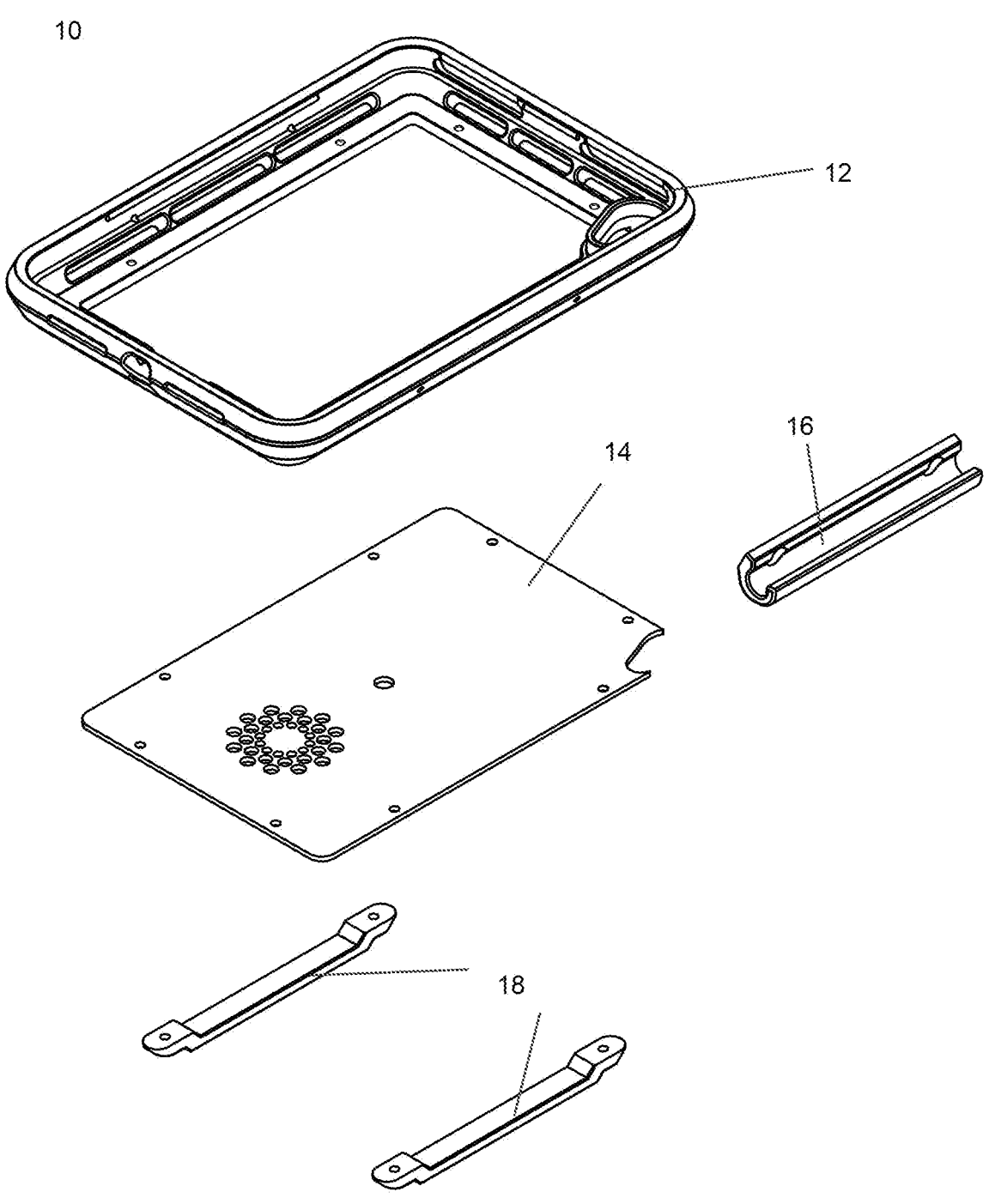
FIG. 3 illustrates the components of the electronic device cooling case according to the present invention.

FIG. 3 illustrates the components of the electronic device cooling case according to the present invention.

Case 10 is comprised of the components illustrated in FIG. 3. Side frame 12 connects to back plate 14. Pen holder 16 is provided attachable to side frame 12.

Mounting brackets 18 can be used to mount case 10 on a variety of mounting systems.

The illustrations of embodiments described herein are intended to provide a general understanding of the structure of various embodiments, and they are not intended to serve as a complete description of all the elements and features of apparatus and systems that might make use of the structures described herein.

Specifically, fan location can vary, battery capacity can vary, air induction location can vary, and air exhaust locations can vary.

Many other embodiments will be apparent to those of skill in the art upon reviewing the above description. Other embodiments may be utilized and derived therefrom, such that structural and logical substitutions and changes may be made without departing from the scope of this disclosure.

Figures are also merely representational and may not be drawn to scale. Certain proportions thereof may be exaggerated, while others may be minimized. Accordingly, the specification and drawings are to be regarded in an illustrative rather than a restrictive sense. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. Therefore, it is intended that the disclosure not be limited to the particular embodiment(s) disclosed.

What is claimed is:

1. A case for an electronic device, comprising:

a rectangular case frame for holding an electronic device, wherein the case frame comprises a carbon fiber back plate;

an internal blower fan directing air across the back of the electronic device, wherein the internal fan draws cool air in from intake openings in the lower center of the back of the case and directs it across the back of the electronic device and through a plurality of downward sloping holes on each of the four sides of the carbon fiber rectangular case frame;

an internal rechargeable case battery for powering the internal fan; and a USB-C port for charging external electronic devices using the internal rechargeable case battery, wherein the intake openings comprise:

a first plurality of round openings arranged in a circular fashion;

a second plurality of round openings arranged in a circular fashion at the periphery of the first plurality of round openings, wherein the second plurality of round openings are larger than the first plurality of round openings; and a third plurality of round openings arranged in a circular fashion at the periphery of the second plurality of round openings, wherein the third plurality of round openings are larger than the second plurality of round openings.

2. The case for an electronic device of claim 1, further comprising a mounting bracket.

3. The case for an electronic device of claim 2, wherein the mounting bracket is compatible with X-Grip Mount and ball mount and pivot.

4. The case for an electronic device of claim 2, wherein the mounting bracket is compatible with MNT-1665 Sport Camera Adapter.

5. The case for an electronic device of claim 2, wherein the mounting bracket is compatible with MAVMOUNT Controller Adapters.

6. The case for an electronic device of claim 1, further comprising an attached pen holder.

7. The case for an electronic device of claim 1, further comprising an on/off switch for the internal fan.

8. A case for an electronic device, comprising:

a carbon impregnated plastic case frame for holding an electronic device, wherein the case frame comprises a back plate and a side frame;

an internal blower fan directing air across the back of the electronic device, wherein the internal blower fan draws cool air in from intake openings in the lower center of the back of the case and directs it across the back of the electronic device and through a plurality of downward sloping holes on each of the four sides of the carbon fiber rectangular case frame;

an internal rechargeable case battery for powering the internal fan; and a USB-C port for charging external electronic devices using the internal rechargeable case battery, wherein the intake openings comprise:

a first plurality of round openings arranged in a circular fashion;

a second plurality of round openings arranged in a circular fashion at the periphery of the first plurality of round openings, wherein the second plurality of round openings are larger than the first plurality of round openings; and a third plurality of round openings arranged in a circular fashion at the periphery of the second plurality of round openings, wherein the third plurality of round openings are larger than the second plurality of round openings.

* * * * *